(12) United States Patent
Stumbo et al.

(10) Patent No.: US 7,115,971 B2
(45) Date of Patent: Oct. 3, 2006

(54) NANOWIRE VARACTOR DIODE AND METHODS OF MAKING SAME

(75) Inventors: David Stumbo, Belmont, CA (US); Jian Chen, Mountain View, CA (US); David Heald, Solvang, CA (US); Yaoling Pan, Union City, CA (US)

(73) Assignee: Nanosys, Inc., Palo Alto, CA (US)

( * ) Notice: Subject to any disclaimer, the term of this patent is extended or adjusted under 35 U.S.C. 154(b) by 196 days.

(21) Appl. No.: 10/806,361

(22) Filed: Mar. 23, 2004

(65) Prior Publication Data

US 2005/0212079 A1 Sep. 29, 2005

(51) Int. Cl.
*H01L 29/93* (2006.01)

(52) U.S. Cl. .............. 257/600; 257/E29.07; 977/762; 438/379

(58) Field of Classification Search ............... 257/600, 257/E29.07; 977/762; 438/379
See application file for complete search history.

(56) References Cited

U.S. PATENT DOCUMENTS

| | | | |
|---|---|---|---|
| 5,962,863 A | 10/1999 | Russell et al. | |
| 6,256,767 B1 | 7/2001 | Kuekes et al. | |
| 6,447,663 B1 | 9/2002 | Lee et al. | |
| 6,566,704 B1 | 5/2003 | Choi et al. | |
| 6,586,785 B1 | 7/2003 | Flagan et al. | |
| 6,760,245 B1 | 7/2004 | Eaton et al. | |
| 6,798,000 B1 | 9/2004 | Luyken et al. | |
| 2002/0117659 A1 | 8/2002 | Lieber et al. | |
| 2002/0127495 A1 | 9/2002 | Scherer | |
| 2002/0130311 A1 | 9/2002 | Lieber et al. | |
| 2002/0130353 A1 | 9/2002 | Lieber et al. | |
| 2002/0163079 A1 | 11/2002 | Awano | |
| 2002/0175408 A1 | 11/2002 | Majumdar et al. | |
| 2003/0012723 A1 | 1/2003 | Clarke | |
| 2003/0042562 A1 | 3/2003 | Giebeler et al. | |
| 2003/0089899 A1 | 5/2003 | Lieber et al. | |
| 2003/0186522 A1 | 10/2003 | Duan et al. | |
| 2003/0189202 A1 | 10/2003 | Li et al. | |
| 2004/0036126 A1 | 2/2004 | Chau et al. | |

(Continued)

FOREIGN PATENT DOCUMENTS

WO  WO-0103208  1/2001

(Continued)

OTHER PUBLICATIONS

Chung et al., "Silicon nanowire devices" Appl. Phys. Letts. (2000) 76(15):2068-2070.

(Continued)

*Primary Examiner*—Jerome Jackson
(74) *Attorney, Agent, or Firm*—Sterne, Kessler, Goldstein & Fox PLLC (57) ABSTRACT

A nanowire varactor diode and methods of making the same are disclosed. The structure comprises a coaxial capacitor running the length of the semiconductor nanowire. In one embodiment, a semiconductor nanowire of a first conductivity type is deposited on a substrate. An insulator is formed on at least a portion of the nanowire's surface. A region of the nanowire is doped with a second conductivity type material. A first electrical contact is formed on at least part of the insulator and the doped region. A second electrical contact is formed on a non-doped potion of the nanowire. During operation, the conductivity type at the surface of the nanowire inverts and a depletion region is formed upon application of a voltage to the first and second electrical contacts. The varactor diode thereby exhibits variable capacitance as a function of the applied voltage.

40 Claims, 4 Drawing Sheets

U.S. PATENT DOCUMENTS

| | | | |
|---|---|---|---|
| 2004/0061422 A1 | 4/2004 | Avouris et al. | |
| 2004/0112964 A1 | 6/2004 | Empedocles et al. | |
| 2004/0175844 A1* | 9/2004 | Yang et al. | 438/2 |
| 2005/0176228 A1* | 8/2005 | Fonash et al. | 438/597 |

FOREIGN PATENT DOCUMENTS

| | | |
|---|---|---|
| WO | WO-0217362 | 2/2002 |
| WO | WO-0248701 | 6/2002 |
| WO | WO-2004032193 | 4/2004 |

OTHER PUBLICATIONS

Duan et al., "High performance thin-film transistors using semiconductor nanowires and nanoribbons" Nature (2003) 425:274-278.

Tans et al., "Room-temperature transistor based on a single carbon nanotube" Nature (1998) 393:49-52.

Yamada "Analysis of submicron carbon nanotube field-effect transistors" Appl. Phys Letts (2000) 76(5):628-630.

* cited by examiner

NANOWIRE VARACTOR DIODE AND METHODS OF MAKING SAME

CROSS REFERENCE TO RELATED APPLICATIONS

Not applicable.

STATEMENT REGARDING FEDERALLY-SPONSORED RESEARCH AND DEVELOPMENT

Not applicable.

BACKGROUND OF THE INVENTION

1. Field of the Invention

The invention relates to nanowires, and more particularly to the implementation of a varactor diode using nanowires and methods of making the same.

2. Background Art

A varactor is a semiconductor diode that functions like a voltage-dependent capacitor. The varactor diode comprises two semiconductor regions: a p-conductivity type doped region and an n-conductivity type doped region. One end of each region is joined to the other region at what is called a PN junction. The other end of each region has an ohmic contact, which allows the diode to be biased.

When no bias is applied, the different energy levels in the two regions cause a diffusion of the holes and electrons through both materials, which balances their energy levels. In the quiescent state (i.e., when this diffusion process stops), the diode is left with a small region on either side of the PN junction, called the depletion region, which contains no free electrons or holes. The movement of electrons through the materials creates an electric field across the depletion region that is described as a barrier potential and has the electrical characteristics of a charged capacitor.

Application of an external bias, applied in either the forward or reverse direction, affects the magnitude, barrier potential, and width of the depletion region. Enough forward bias will overcome the barrier potential and cause current to flow through the diode. Keeping the bias voltage at levels that do not allow current flow will permit the width of the depletion region to be controlled. Since the depletion region acts as a capacitor, the diode will perform as a variable capacitor that changes with the applied bias voltage.

Varactor diodes are used in various circuit applications, such as electronic tuning of oscillators, filters, RF and microwave multipliers, and the like. A unique characteristic of the variable capacitance property of the varactor lends to use in other circuit applications, such as amplifiers, to produce much lower internal noise levels than circuits that depend upon resistance properties. Since noise is of primary concern in receivers, for example, circuits using varactors are an important development in the field of low-noise amplification. Uses of varactors to date have been as the basic component in parametric amplifiers, phase-shifters, and the like.

With the continued miniaturization of circuit components, designers will inevitably seek components of nano dimensions. Nanowire field effect transistors (FETs) have been proposed, by Charles M. Lieber et al., in Published U.S. Patent Application 2002117659. Thus, what is needed is a nano-scale varactor diode.

BRIEF SUMMARY OF THE INVENTION

The varactor diode of the present invention can be made by supporting a semiconductor nanowire on a substrate, wherein the nanowire is of a first conductivity type and has a length and a diameter thereby defining a surface. The substrate can be an insulator, a semiconductor, a plastic or a ceramic.

An insulator is formed on at least a portion of the surface. Alternatively, this insulator (e.g., an oxide) can be formed on the nanowire in situ prior to the nanowire being harvested from its growth substrate.

A region of the nanowire is doped with a second conductivity type material. A first electrical contact is formed on at least part of the insulator and the second doped region. The doped region facilitates good conduction between the first electrical contact and the nanowire. A second electrical contact is formed on a conductivity type doped portion of the nanowire.

During operation, the conductivity type at the surface of the nanowire inverts and a depletion region is formed upon application of a voltage to the first and second electrical contacts. The varactor diode thereby exhibits variable capacitance as a function of the applied voltage.

In another embodiment, the first electrical contact is formed on a substantial portion of the insulator, such that the varactor diode has a structure similar to a coaxial capacitor.

Alternatively, the first conductor layer can also be formed in situ prior to the nanowire being harvested from its growth substrate.

These and other objects, advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. Furthermore, for purposes of brevity, the invention is frequently described herein as pertaining to nanowires, and to a semiconductor diode device.

Moreover, while a single nanowire is illustrated for the specific implementations discussed, the implementations are not intended to be limiting and a wide range of the number of nanowires and spacing can also be used. It should be appreciated that although nanowires are frequently referred to, the techniques described herein are also applicable to nanorods, nanotubes, and nanoribbons. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, the term "nanowire" generally refers to any elongated conductive or semiconductive material (or other material described herein) that includes at least one cross sectional dimension that is less than 500 nm, and preferably, less than 100 nm, and has an aspect ratio (length: width) of greater than 10, preferably greater than 50, and more preferably, greater than 100. Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions, which are incorporated herein by reference.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

While the example implementations described herein principally use CdS and Si, other types of materials for nanowires and nanoribbons can be used, including semiconductive nanowires or nanoribbons, that are comprised of semiconductor material selected from, e.g., Si, Ge, Sn, Se, Te, B, C (including diamond), P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN2, CaCN2, ZnGeP2, CdSnAs2, ZnSnSb2, CuGeP3, CuSi2P3, (Cu, Ag)(Al, Ga, In, Tl, Fe)(S, Se, Te)2, Si3N4, Ge3N4, Al2O3, (Al, Ga, In)2 (S, Se, Te)3, Al2CO, and an appropriate combination of two or more such semiconductors. Other now known or later developed semiconductor materials can be employed.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si.; or an n-type dopant selected from a group consisting of: Si, Ge, Sn, S, Se and Te. Other now known or later developed dopant materials can be employed.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

In the context of the invention, although the focus of the detailed description relates to use of a nanowire, nanorod, nanotube, or nanoribbon on an insulating substrate, the substrate to which these nano structures are attached may comprise other materials, including, but not limited to: plastic, a uniform substrate, e.g., a wafer of solid material, such as silicon, glass, quartz, polymerics, etc.; a large rigid sheet of solid materials, e.g., glass, quartz, plastics such as polycarbonate, polystyrene, etc., or can comprise additional elements, e.g., structural, compositional, etc. A flexible substrate, such as a roll of plastic such as polyolefins, polyamide, and others, a transparent substrate, or combinations of these features can be employed. For example, the substrate may include other circuit or structural elements that are part of the ultimately desired device. Particular examples of such elements include electrical circuit elements such as electrical contacts, other wires or conductive paths, including nanowires or other nanoscale conducting elements, optical and/or optoelectrical elements (e.g., lasers, LEDs, etc.), and structural elements (e.g., microcantilevers, pits, wells, posts, etc.).

The insulator used in connection with the present invention can be any insulator material such as oxide, as would be apparent to a person having ordinary skill in the art. Moreover, the conductors described below can be any conductor, such as a metal or metal alloy, or semiconductor material, as would also be apparent to a person having ordinary skill in the art. Thus, other now known or later developed insulator materials can be employed.

It should be understood that the spatial descriptions (e.g., "above", "below", "up", "down", "top", "bottom", etc.) made herein are for purposes of illustration only, and that devices of the present invention can be spatially arranged in any orientation or manner.

There are many advantages of nanowires compared to standard semiconductors, including the use of insulating, flexible, or low-loss substrates, cost, and the ability to integrate nanowires into large structures. The present invention is directed to methods which apply these advantages to the construction of a varactor diode.

The Nanowire Varactor Diode Embodiments

The nanowire varactor diode of the present invention comprises a coaxial capacitor running the length of the semiconductor nanowire by the correct combination of contacts, insulators, doping and geometry.

FIGS. 1A through 1E are cross sectional views of a nanowire varactor diode according to the present invention. FIGS. 1A through 1E show an embodiment used to illustrate one of many methods that can be used to make nanowire varactor diodes according to the present invention. Various substitutions and alternatives to the process steps described herein can be made without departing from the spirit and scope of the present invention.

Figure 1A:
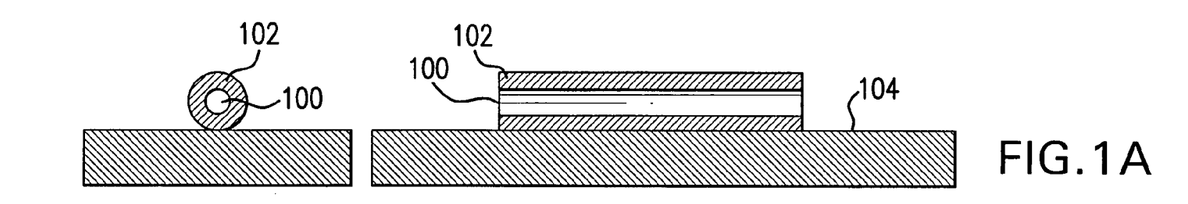
FIGS. 1A through 1E are cross sectional views of a nanowire varactor diode, according to an example embodiment of the present invention.

FIG. 1A illustrates a single crystal semiconductor nanowire core (hereafter "nanowire") 100 having an insulating shell 102. The nanowire 100 is deposited on a device substrate 104. Prior to this arrangement, however, nanowires are first formed on a growth substrate (not shown) and can be processed (e.g., coated) to form the insulated shell 102 as described in co-pending U.S. patent application Ser. No. 10/674,060, filed Sep. 30, 2003, titled "Large Area Nanoenabled Macroelectronic Substrates and Uses Therefore", and U.S. Provisional Application Nos. 60/453,198, filed Mar. 11, 2003, titled "Process for Producing Nanocrystals and Nanocrystals Produced Thereby" and 60/491,979 filed Aug. 4, 2003, titled "System and Process for Producing Nanowire Composites and Electronic Substrates Therefrom", which are incorporated herein by reference in their entirety. The coated nanowires are then harvested. The harvested nanowires are then deposited onto the device substrate 104 as shown in FIG. 1A.

While a single nanowire is shown, a plurality of individual nanowires closely located together can be processed together to form a plurality of nanowire varactor diodes or a single varactor diode comprising plural nanowires.

Figure 1B:
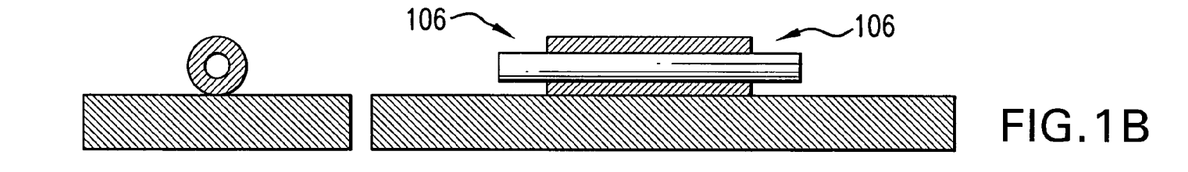

FIG. 1B illustrates the removal of portions of the insulating layers 102, as shown generally at sections 106. Conventional masking and oxide removal processes can be used, for example, as would be apparent to a person having ordinary skill in the art.

Figure 1C:
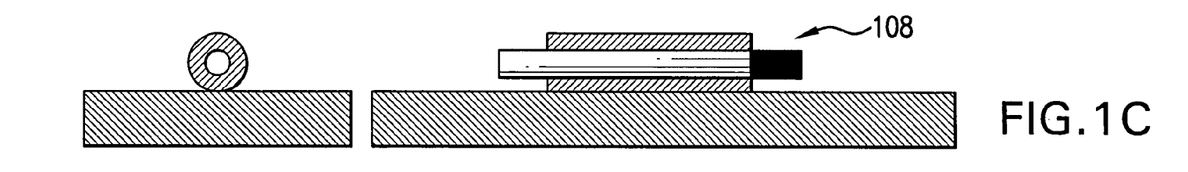

FIG. 1C illustrates the doping of a portion of the nanowire core 100, shown generally at a section 108. Doping can be implemented using masking, ion implantation, ion shower, chemical vapor deposition, gas immersion laser diffusion, or other techniques, as would be apparent to a person having ordinary skill in the art. The connectivity type of the doping used is the opposite of the conductivity type of the nanowire core material 100. Region 108 is doped to a high doping concentration to facilitate good electrical conduction to an inversion layer induced at the outer surface of the nanowire during operation, as described below in connection with FIGS. 2A and 2B.

Figure 1D:
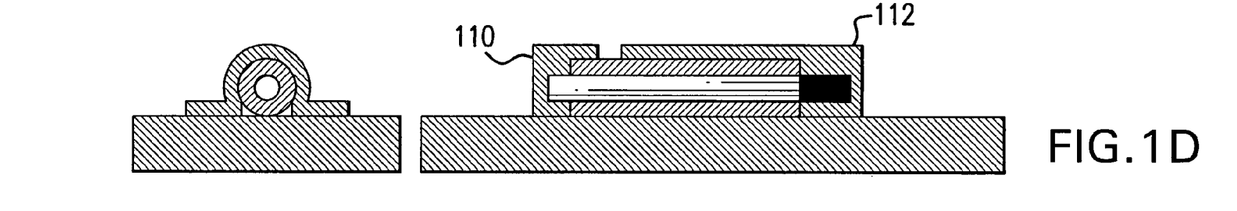

FIG. 1D illustrates metallization of the nanowire varactor diode. Two metallization regions 110 and 112 are shown in FIG. 1D. Metallization 110 is used to form a first contact with the nanowire core 100. The second metallization 112 is used to form a second electrical contact with the highly doped region 108. Additionally, the second metallization 112 covers or otherwise surrounds a substantial portion of the insulated shell 102. An additional metallization (not shown) can be formed under a portion of the nanowire and electrically coupled to the second electrical contact (represented by metallization 112). This additional metallization underneath the nanowire is patterned so as not to be electrically coupled to metallization 110 (i.e., the first contact).

Figure 1E:
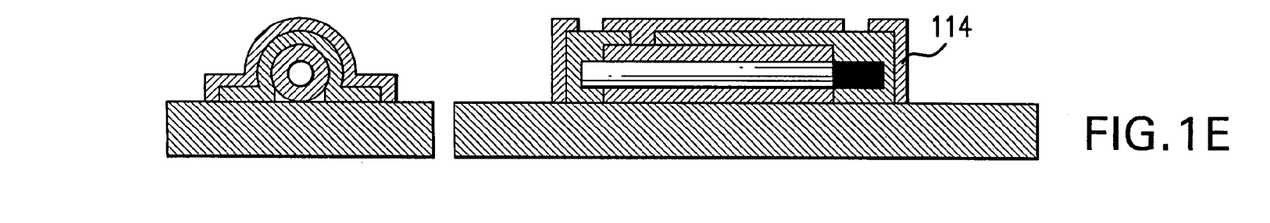

FIG. 1E illustrates pattern passivation of the nanowire varactor diode according to the present invention. Passivation layer 114 is formed of an insulator, such as an oxide, epoxy, or the like, as would be apparent to a person having ordinary skill in the art.

An alternative to the process described above in connection with FIGS. 1A–1E involves metallization of the nanowire prior to harvesting from the growth substrate. In this case, the metallization described in connection with FIG. 1D and associated patterning would be modified so as to properly form the first and second electrical contacts. This precoating metallization would avoid the need to pattern a metal on substrate 104 prior to depositing the nanowire so as to have the second electrical contact surround the nanowire.

Figure 2A:
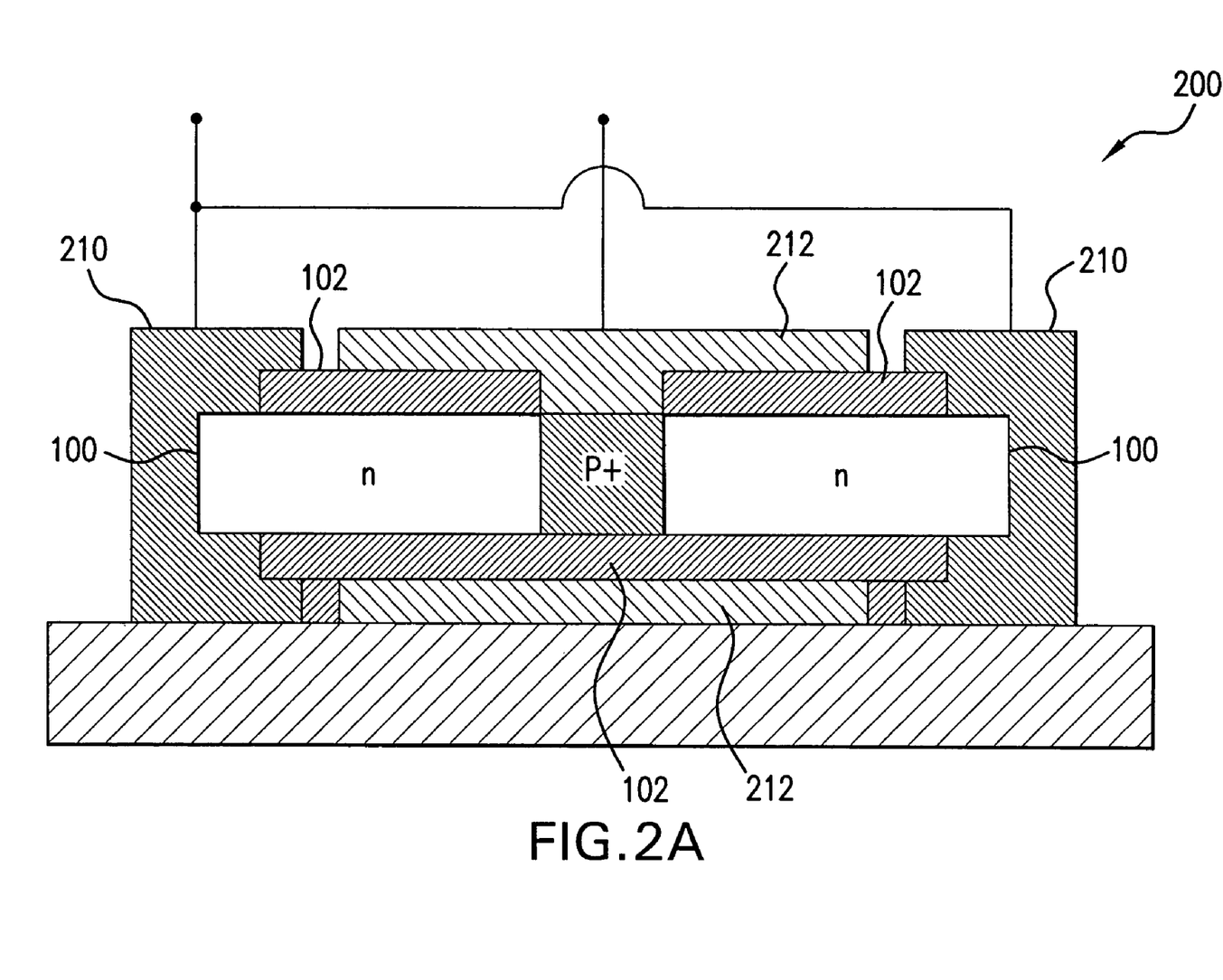
FIGS. 2A and 2B illustrates a nanowire varactor diode, according to another embodiment of the present invention.

FIG. 2A illustrates a nanowire varactor diode 200, according to an embodiment of the present invention. The nanowire varactor diode 200 has a coaxial capacitor structure, with the core 100 separated from an outer coaxial conductor 212 by the shell insulator 102. The nanowire core 100 has a first electrical contact (a cathode) 210 and a second electrical contact (an anode), which is the outer conductor 212. The first and second electrical contacts can be connection, directly or otherwise, to a supply voltage (not shown). However, the nanowire varactor diode 200 can be integrated into any circuit utilizing the nanowire varactor diode's variable capacitance characteristic.

In this example, the ends of nanowire core 100 are a n-type semiconductor material. A highly doped p-type region (p+) is shown in the center of the nanowire as an alternate embodiment to region 108 of the configuration illustrated in FIGS. 1A–1E. The series resistance of the varactor 200 is half that of the single-ended varactor diode illustrated in FIGS. 1A–1E.

Figure 2B:
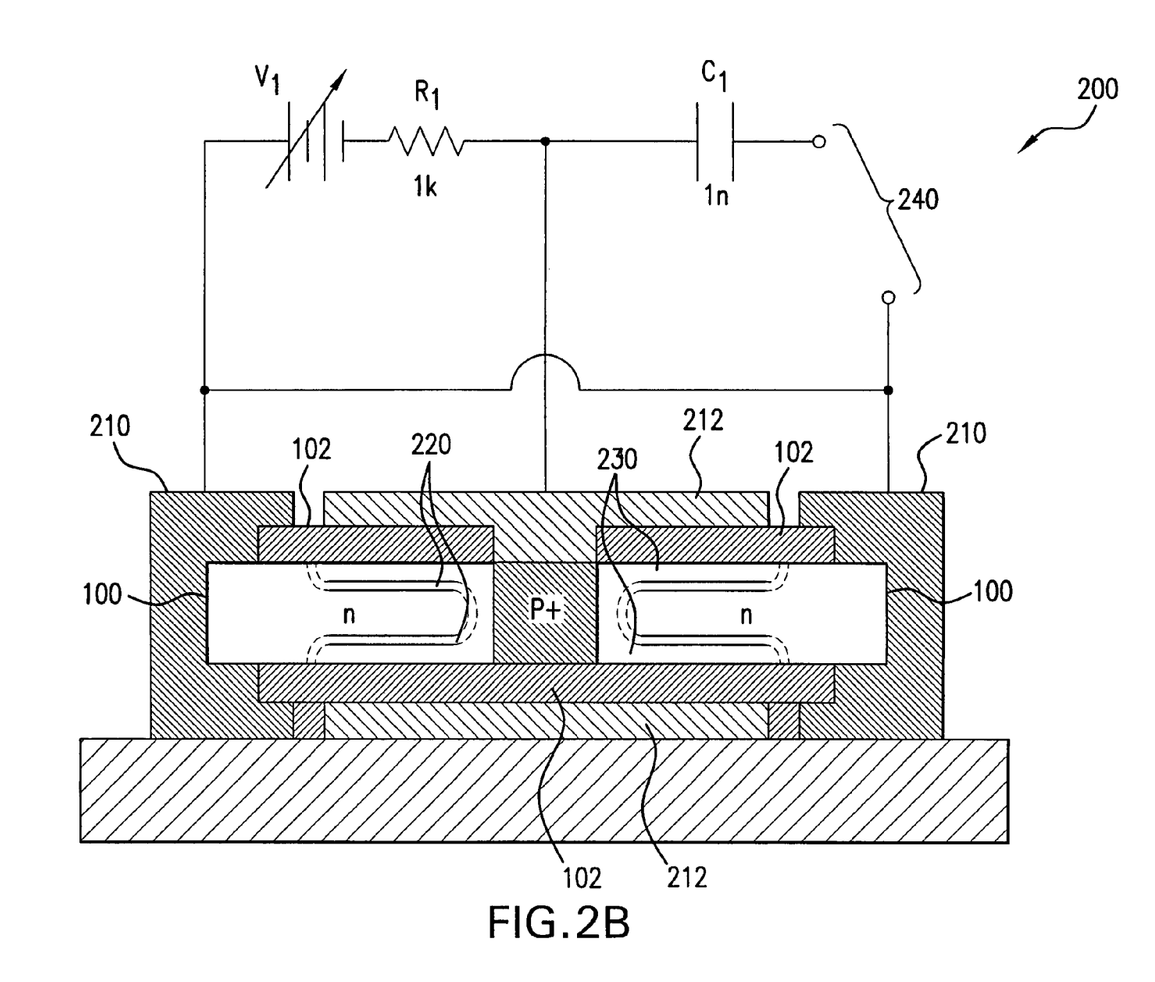

FIG. 2B illustrates the nanowire varactor diode 200 under reverse bias conditions. A semiconductor depletion region 220 (illustrated by the dashed lines) is formed by the voltage difference between the outer conductor 212 and the core 100. The conductivity type of the outer portion of the nanowire that is concentric to the depletion region 220 is inverted (see p-type conductivity inversion region 230). Thus, capacitance between the conducting (due to doping) core 100 of the nanowire and the outer conductor 212 (due to inversion) through the semiconductor depletion region 220 in between acts as a voltage variable capacitor.

An exemplary circuit including a variable voltage supply ($V_1$), resistor ($R_1$) and capacitor ($C_1$), is connected to the nanowire varactor diode 200. Adjusting the variable voltage supply will cause the varactor's depletion region 220 to change. The resulting variable capacitance can be observed at the output notes 240.

The varactor diode of the present invention can be integrated with components, including but not limited to the dense, inorganic and oriented nanowire thin film (DION) macroelectronic circuits described in co-pending U.S. patent application Ser. No. 10/674,071 (filed Sep. 30, 2003), titled "Applications of Nano-Enabled Large Area Macroelectronic Substrates Incorporating Nanowires and Nanowire Composites", which is incorporated herein by reference. In particular, the varactor diode embodiments of the present invention can be used as the delay element in the various adjustable phase shifters described in the '071 application. Moreover, as would become apparent to a person having ordinary skill in the art, the varactor diode embodiments of the present invention can be used in a plethora of other circuits.

The conductivity types illustrated in FIGS. 2A and 2B are given as examples only. The conductivity types can be reversed and the functionality of the device maintained.

The varactor diode of FIG. 1 is biased in a similar manner as varactor diode 200 of FIG. 2. The first contact (metallization 110) and the second contact (metallization 112) are analogous to the first electrical contact 210 and second electrical contacts 210, respectively.

Figure 3:
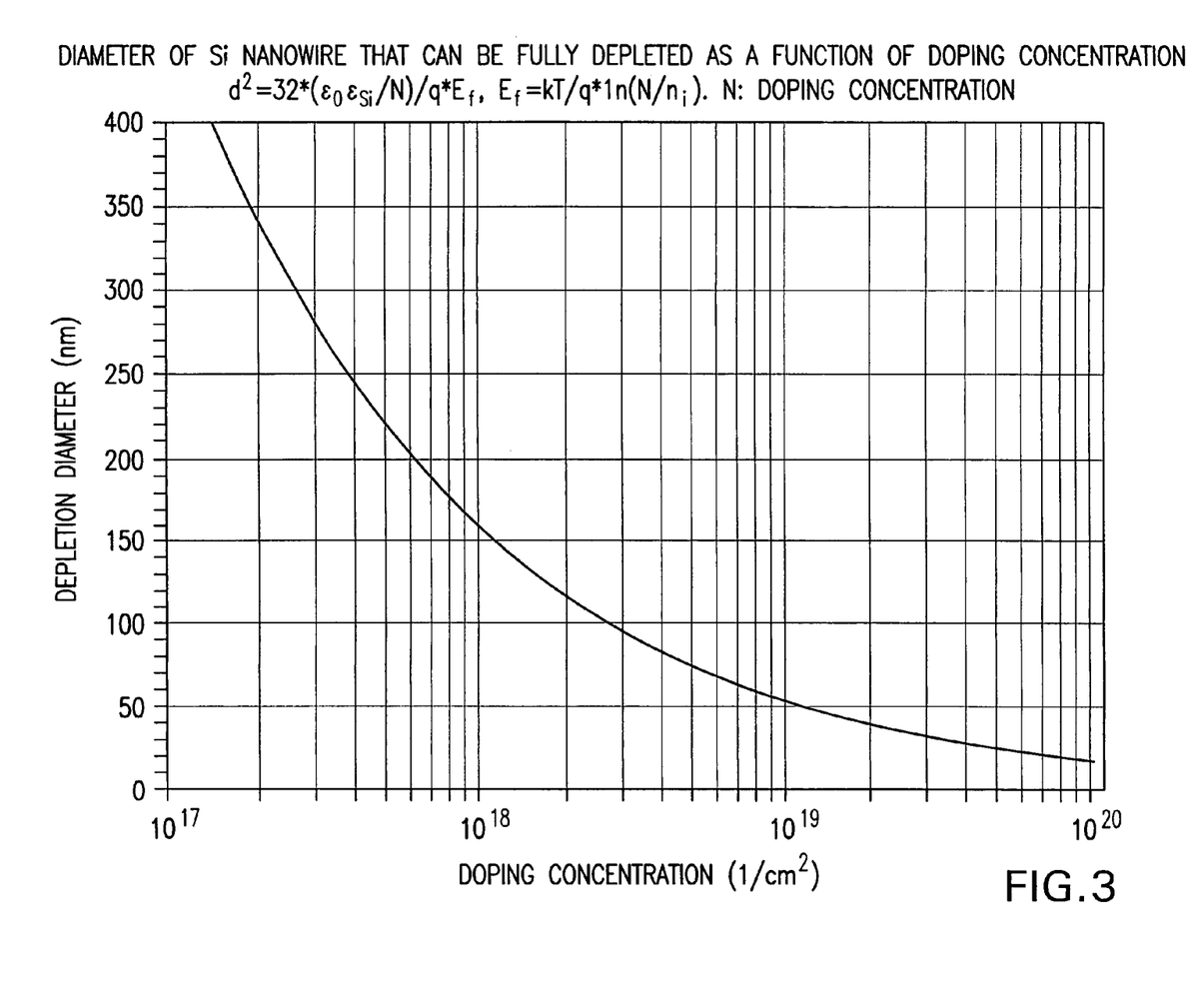
FIG. 3 is a plot illustrating that the diameter of a silicon nanowire can be fully depleted as a function of doping concentration.

FIG. 3 is a plot illustrating that the diameter of a silicon nanowire can be fully depleted as a function of doping concentration. In this case, the depletion region is measured in nanometers (nm) and the doping concentration unit is (1/cm$^2$). The operational region in this plot is represented by the region above and to the right of the curve.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A varactor diode, comprising:
   a substrate;
   a semiconductor nanowire, supported by said substrate, having a first conductivity type and having a region doped with a second conductivity type, wherein said nanowire has a length and a diameter thereby defining a surface;
   an insulator formed on at least a portion of said surface;
   a first electrical contact formed on at least part of said insulator and coupled to said doped region; and
   a second electrical contact coupled to said nanowire, wherein an inversion layer is formed at a region at the surface of said nanowire and a depletion region is formed within said nanowire upon application of a voltage between said first and second electrical contacts, such that the varactor diode exhibits variable capacitance as a function of the applied voltage.

2. A circuit comprising a plurality of components, wherein at least one of said plurality of components is electrically coupled to the varactor diode of claim 1.

3. The circuit of claim 2, wherein the plurality of components and the varactor diode form a phase-shifter.

4. A circuit comprising a plurality of nanowires configured as the varactor diode of claim 1.

5. The varactor diode of claim 1, wherein said substrate is an insulating material, a semiconductor, a plastic or a ceramic.

6. The varactor diode of claim 1, wherein said first electrical contact is formed around a substantial portion of said insulator.

7. The varactor diode of claim 1, wherein said first conductivity type is P and said second conductivity type is N.

8. The varactor diode of claim 7, wherein said region is doped N+ type.

9. The varactor diode of claim 8, wherein said N+ type region is formed at an end of said nanowire.

10. The varactor diode of claim 1, wherein said first conductivity type is N and said second conductivity type is P.

11. The varactor diode of claim 10, wherein said region is doped P+ type.

12. The varactor diode of claim 11, wherein said P+ region is formed at an end of said nanowire.

13. A method of making a varactor diode, comprising:
    (a) depositing a semiconductor nanowire, having a first conductivity type, on a substrate, wherein said nanowire has a length and a diameter thereby defining an surface;
    (b) forming an insulator on at least a portion of the surface;
    (c) doping a region of the nanowire with a second conductivity type material;
    (d) forming a first electrical contact on at least part of the insulator and the doped region; and
    (e) forming a second electrical contact on the nanowire, wherein an inversion layer is formed at a region at the surface of the nanowire and a depletion region is formed within the nanowire upon application of a voltage between the first and second electrical contacts, such that the varactor diode exhibits variable capacitance as a function of the applied voltage.

14. The method of claim 13, wherein the substrate is an insulating material, a semiconductor, a plastic or a ceramic.

15. The method of claim 13, wherein the first electrical contact is also formed on a substantial portion of the insulator.

16. The method of claim 13, further comprising removing a portion of the insulator to facilitate said doping of step (c).

17. The method of claim 16, further comprising removing a portion of the insulator from an end of the nanowire.

18. The method of claim 13, wherein the first conductivity type is P and the second conductivity type is N.

19. The method of claim 18, wherein the region is doped N+ type.

20. The method of claim 13, wherein the first conductivity type is N and the second conductivity type is P.

21. The method of claim 20, wherein the region is doped P+ type.

22. A method of making a varactor diode, comprising:
    (a) depositing a semiconductor nanowire on a substrate, the nanowire having a first conductivity type core and an insulating shell;
    (b) doping a region of the nanowire with a second conductivity type material;
    (c) forming a first electrical contact on at least part of the insulator and the doped region; and
    (d) forming a second electrical contact on the nanowire, wherein an inversion layer is formed at a region at the surface of the nanowire and a depletion region is formed within the nanowire upon application of a voltage between the first and second electrical contacts, such that the varactor diode exhibits variable capacitance as a function of the applied voltage.

23. The method of claim 22, wherein the substrate is an insulating material, a semiconductor, a plastic or a ceramic.

24. The method of claim 22, wherein the first electrical contact is formed on a substantial portion of the insulator.

25. The method of claim 22, further comprising removing a portion of the insulator to facilitate said doping of step (b).

26. The method of claim 25, further comprising removing a portion of the insulator from an end of the nanowire.

27. The method of claim 22, wherein the first conductivity type is P and the second conductivity type is N.

28. The method of claim 27, wherein the region is doped N+ type.

29. The method of claim 22, wherein the first conductivity type is N and the second conductivity type is P.

30. The method of claim 29, wherein the region is doped P+ type.

31. A method of making a varactor diode, comprising:
(a) depositing a semiconductor nanowire on a substrate, the nanowire having a first conductivity type core, an insulating shell, and a conductor layer surrounding the shell;
(b) doping a region of the nanowire with a second conductivity type material;
(c) forming a first electrical contact on the conductor layer and the doped region; and
(d) forming a second electrical contact on the nanowire, wherein an inversion layer is formed at a region at the surface of the nanowire and a depletion region is formed within the nanowire upon application of a voltage between the first and second electrical contacts, such that the varactor diode exhibits variable capacitance as a function of the applied voltage.

32. The method of claim 31, wherein the substrate is an insulating material, a semiconductor, a plastic or a ceramic.

33. The method of claim 31, wherein the first electrical contact is formed on a substantial portion of the insulator.

34. The method of claim 31, further comprising removing a portion of the insulator and the conductor layer to facilitate said doping of step (b).

35. The method of claim 32, further comprising removing a portion of the insulator from an end of the nanowire.

36. The method of claim 31, wherein the first conductivity type is P and the second conductivity type is N.

37. The method of claim 36, wherein the region is doped N+ type.

38. The method of claim 31, wherein the first conductivity type is N and the second conductivity type is P.

39. The method of claim 38, wherein the region is doped P+ type.

40. A varactor diode, comprising:
a substrate;
a semiconductor nanowire having a solid core, supported by said substrate, having a first conductivity type and having a region doped with a second conductivity type, wherein said nanowire has a length and a diameter thereby defining an surface;
an insulator formed on at least a portion of said surface;
a first electrical contact formed on at least part of said insulator and coupled to said doped region; and
a second electrical contact coupled to said nanowire, wherein an inversion layer is formed at a region at the surface of said nanowire and a depletion region is formed within said nanowire upon application of a voltage between said first and second electrical contacts, such that the varactor diode exhibits variable capacitance as a function of the applied voltage.

* * * * *

UNITED STATES PATENT AND TRADEMARK OFFICE
CERTIFICATE OF CORRECTION

PATENT NO. : 7,115,971 B2 Page 1 of 1
APPLICATION NO. : 10/806361
DATED : October 3, 2006
INVENTOR(S) : Stumbo et al.

It is certified that error appears in the above-identified patent and that said Letters Patent is hereby corrected as shown below:

Title Page, References Cited (56), line 3, delete "6,256,767" and insert -- 6,245,767 --.

Signed and Sealed this

Eighth Day of July, 2008

JON W. DUDAS
*Director of the United States Patent and Trademark Office*